United States Patent
Khan et al.

(10) Patent No.: US 11,361,978 B2
(45) Date of Patent: *Jun. 14, 2022

(54) GAS DELIVERY MODULE

(71) Applicant: Applied Materials, Inc., Santa Clara, CA (US)

(72) Inventors: Adib M. Khan, Santa Clara, CA (US); Qiwei Liang, Fremont, CA (US); Sultan Malik, Sacramento, CA (US); Srinivas D. Nemani, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/926,422

(22) Filed: Jul. 10, 2020

(65) Prior Publication Data

US 2020/0343103 A1 Oct. 29, 2020

Related U.S. Application Data

(63) Continuation of application No. 16/510,847, filed on Jul. 12, 2019, now Pat. No. 10,748,783.

(60) Provisional application No. 62/703,251, filed on Jul. 25, 2018.

(51) Int. Cl.
*H01L 21/447* (2006.01)
*C23C 16/452* (2006.01)
*H01L 21/67* (2006.01)

(52) U.S. Cl.
CPC .......... *H01L 21/447* (2013.01); *C23C 16/452* (2013.01); *H01L 21/67011* (2013.01)

(58) Field of Classification Search
CPC ............ H01L 21/447; H01L 21/67011; H01L 21/67017; H01L 21/6719; H01L 21/67126; C23C 16/452
See application file for complete search history.

(56) References Cited

U.S. PATENT DOCUMENTS

| | | | |
|---|---|---|---|
| 3,684,592 | A | 8/1972 | Chang et al. |
| 3,749,383 | A | 7/1973 | Voigt et al. |
| 3,758,316 | A | 9/1973 | Sowards et al. |
| 4,409,260 | A | 10/1983 | Pastor et al. |
| 4,424,101 | A | 1/1984 | Nowicki |
| 4,524,587 | A | 6/1985 | Kantor |

(Continued)

FOREIGN PATENT DOCUMENTS

| | | |
|---|---|---|
| CN | 1280875 C | 10/2006 |
| CN | 101871043 A | 10/2010 |

(Continued)

OTHER PUBLICATIONS

International Search Report and Written Opinion from PCT/US2018/034036 dated Aug. 24, 2018.

(Continued)

*Primary Examiner* — Nikolay K Yushin
(74) *Attorney, Agent, or Firm* — Patterson + Sheridan LLP

(57) ABSTRACT

The present disclosure relates to high pressure processing apparatus for semiconductor processing. The apparatus described herein include a high pressure process chamber and a containment chamber surrounding the process chamber. A high pressure fluid delivery module is in fluid communication with the high pressure process chamber and is configured to deliver a high pressure fluid to the process chamber.

20 Claims, 2 Drawing Sheets

(56) References Cited

U.S. PATENT DOCUMENTS

| | | |
|---|---|---|
| 4,576,652 A | 3/1986 | Hovel et al. |
| 4,589,193 A | 5/1986 | Goth et al. |
| 4,879,259 A | 11/1989 | Reynolds et al. |
| 5,050,540 A | 9/1991 | Lindberg |
| 5,114,513 A | 5/1992 | Hosokawa et al. |
| 5,126,117 A | 6/1992 | Schumacher et al. |
| 5,149,378 A | 9/1992 | Ohmi et al. |
| 5,167,717 A | 12/1992 | Boitnott |
| 5,175,123 A | 12/1992 | Vasquez et al. |
| 5,300,320 A | 4/1994 | Barron et al. |
| 5,314,541 A | 5/1994 | Saito et al. |
| 5,319,212 A | 6/1994 | Tokoro |
| 5,366,905 A | 11/1994 | Mukai |
| 5,472,812 A | 12/1995 | Sekine |
| 5,578,132 A | 11/1996 | Yamaga et al. |
| 5,590,695 A | 1/1997 | Siegele et al. |
| 5,597,439 A | 1/1997 | Salzman |
| 5,620,524 A | 4/1997 | Fan et al. |
| 5,677,230 A | 10/1997 | Weitzel et al. |
| 5,747,383 A | 5/1998 | Chen et al. |
| 5,808,245 A | 9/1998 | Wiese et al. |
| 5,857,368 A | 1/1999 | Grunes et al. |
| 5,858,051 A | 1/1999 | Komiyama et al. |
| 5,877,087 A | 3/1999 | Mosely et al. |
| 5,879,756 A | 3/1999 | Fathi et al. |
| 5,880,041 A | 3/1999 | Ong |
| 5,886,864 A | 3/1999 | Dvorsky |
| 5,888,888 A | 3/1999 | Talwar et al. |
| 5,918,149 A | 6/1999 | Besser et al. |
| 5,940,985 A | 8/1999 | Kamikawa et al. |
| 6,071,810 A | 6/2000 | Wada et al. |
| 6,077,571 A | 6/2000 | Kaloyeros |
| 6,082,950 A | 7/2000 | Altwood et al. |
| 6,086,730 A | 7/2000 | Liu |
| 6,103,585 A | 8/2000 | Michaelis |
| 6,136,664 A | 10/2000 | Economikos et al. |
| 6,140,235 A | 10/2000 | Yao et al. |
| 6,150,286 A | 11/2000 | Sun et al. |
| 6,164,412 A | 12/2000 | Allman |
| 6,207,487 B1 | 3/2001 | Kim et al. |
| 6,242,368 B1 | 6/2001 | Holmer et al. |
| 6,242,808 B1 | 6/2001 | Shimizu et al. |
| 6,251,242 B1 | 6/2001 | Fu et al. |
| 6,251,751 B1 | 6/2001 | Chu et al. |
| 6,277,249 B1 | 8/2001 | Gopalraja et al. |
| 6,284,646 B1 | 9/2001 | Leem |
| 6,299,753 B1 | 10/2001 | Chao et al. |
| 6,305,314 B1 | 10/2001 | Sneh et al. |
| 6,319,766 B1 | 11/2001 | Bakli et al. |
| 6,319,847 B1 | 11/2001 | Ishikawa |
| 6,334,249 B2 | 1/2002 | Hsu |
| 6,334,266 B1 | 1/2002 | Moritz et al. |
| 6,335,240 B1 | 1/2002 | Kim et al. |
| 6,344,249 B1 | 2/2002 | Maruyama et al. |
| 6,344,419 B1 | 2/2002 | Forster et al. |
| 6,348,376 B2 | 2/2002 | Lim et al. |
| 6,355,558 B1 | 3/2002 | Dixit |
| 6,358,829 B2 | 3/2002 | Yoon et al. |
| 6,368,412 B1 | 4/2002 | Gomi |
| 6,372,598 B2 | 4/2002 | Kang et al. |
| 6,387,764 B1 | 5/2002 | Curtis et al. |
| 6,399,486 B1 | 6/2002 | Chen et al. |
| 6,399,491 B2 | 6/2002 | Jeon et al. |
| 6,416,822 B1 | 7/2002 | Chiang et al. |
| 6,428,859 B1 | 8/2002 | Chiang et al. |
| 6,442,980 B2 | 9/2002 | Preston et al. |
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,490 B1 | 10/2002 | Shamouilian et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,500,603 B1 | 12/2002 | Shioda |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,583,497 B2 | 6/2003 | Xia et al. |
| 6,585,823 B1 | 7/2003 | Van Wijck |
| 6,599,572 B2 | 7/2003 | Saanila et al. |
| 6,599,819 B1 | 7/2003 | Goto |
| 6,607,976 B2 | 8/2003 | Chen et al. |
| 6,619,304 B2 | 9/2003 | Worm |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,657,304 B1 | 12/2003 | Woo et al. |
| 6,660,660 B2 | 12/2003 | Haukka et al. |
| 6,686,271 B2 | 2/2004 | Raaijmakers et al. |
| 6,780,777 B2 | 8/2004 | Yun et al. |
| 6,797,336 B2 | 9/2004 | Garvey et al. |
| 6,825,115 B1 | 11/2004 | Xiang et al. |
| 6,841,432 B1 | 1/2005 | Takemura et al. |
| 6,849,122 B1 | 2/2005 | Fair |
| 6,867,130 B1 | 3/2005 | Karlsson et al. |
| 6,867,152 B1 | 3/2005 | Hausmann et al. |
| 6,889,627 B1 | 5/2005 | Hao |
| 6,897,118 B1 | 5/2005 | Poon et al. |
| 6,969,448 B1 | 11/2005 | Lau |
| 7,055,333 B2 | 6/2006 | Leitch et al. |
| 7,084,079 B2 | 8/2006 | Conti et al. |
| 7,105,061 B1 | 9/2006 | Shrinivasan et al. |
| 7,111,630 B2 | 9/2006 | Mizobata et al. |
| 7,114,517 B2 | 10/2006 | Sund et al. |
| 7,211,525 B1 | 5/2007 | Shanker et al. |
| 7,282,458 B2 | 10/2007 | Gates et al. |
| 7,361,231 B2 | 4/2008 | Fury et al. |
| 7,429,402 B2 | 9/2008 | Gandikota et al. |
| 7,432,200 B2 | 10/2008 | Chowdhury et al. |
| 7,460,760 B2 | 12/2008 | Cho et al. |
| 7,465,650 B2 | 12/2008 | Derderian |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,629,227 B1 | 12/2009 | Wang et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,691,442 B2 | 4/2010 | Gandikota et al. |
| 7,709,320 B2 | 5/2010 | Cheng |
| 7,759,749 B2 | 7/2010 | Tanikawa |
| 7,825,038 B2 | 11/2010 | Ingle et al. |
| 7,825,042 B2 | 11/2010 | Mandal |
| 7,867,914 B2 | 1/2011 | Xi et al. |
| 7,867,923 B2 | 1/2011 | Mallick et al. |
| 7,891,228 B2 | 2/2011 | Ding et al. |
| 7,910,165 B2 | 3/2011 | Ganguli et al. |
| 7,964,505 B2 | 6/2011 | Khandelwal et al. |
| 7,964,506 B1 | 6/2011 | Ponnuswamy et al. |
| 8,027,089 B2 | 9/2011 | Hayashi |
| 8,278,224 B1 | 10/2012 | Mui et al. |
| 8,306,026 B2 | 11/2012 | Anjum et al. |
| 8,318,584 B2 | 11/2012 | Li et al. |
| 8,349,085 B2 | 1/2013 | Tahara et al. |
| 8,449,942 B2 | 5/2013 | Liang et al. |
| 8,455,368 B2 | 6/2013 | Chandler et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,585,873 B2 | 11/2013 | Ford et al. |

(56) References Cited

U.S. PATENT DOCUMENTS

| | | |
|---|---|---|
| 8,647,992 B2 | 2/2014 | Liang et al. |
| 8,648,253 B1 | 2/2014 | Woods et al. |
| 8,668,868 B2 | 3/2014 | Chiu et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,190,321 B2 | 11/2015 | Cabral, Jr. et al. |
| 9,257,314 B1 | 2/2016 | Rivera et al. |
| 9,306,026 B2 | 4/2016 | Toriumi et al. |
| 9,330,939 B2 | 5/2016 | Zope et al. |
| 9,362,107 B2 | 6/2016 | Thadani et al. |
| 9,382,621 B2 | 7/2016 | Choi et al. |
| 9,423,313 B2 | 8/2016 | Douba et al. |
| 9,484,406 B1 | 11/2016 | Sun et al. |
| 9,502,307 B1 | 11/2016 | Bao et al. |
| 9,570,551 B1 | 2/2017 | Balakrishnan et al. |
| 9,583,655 B2 | 2/2017 | Cheng |
| 9,646,850 B2 | 5/2017 | Pethe |
| 9,679,810 B1 | 6/2017 | Nag et al. |
| 9,685,371 B2 | 6/2017 | Zope et al. |
| 9,695,503 B2 | 7/2017 | Stowell et al. |
| 9,741,626 B1 | 8/2017 | Cheng et al. |
| 9,777,378 B2 | 10/2017 | Nemani et al. |
| 10,049,927 B2 | 8/2018 | Mebarki et al. |
| 10,083,834 B2 | 9/2018 | Thompson et al. |
| 10,096,516 B1 | 10/2018 | Leschkies et al. |
| 10,179,941 B1 | 1/2019 | Khan et al. |
| 10,224,224 B2 | 3/2019 | Liang et al. |
| 10,234,630 B2 | 3/2019 | Meyer Timmerman Thijssen et al. |
| 10,269,571 B2 | 4/2019 | Wong et al. |
| 10,276,411 B2 | 4/2019 | Delmas et al. |
| 10,403,729 B2 | 9/2019 | Lee |
| 10,410,918 B2 | 9/2019 | Wu et al. |
| 10,529,585 B2 | 1/2020 | Manna et al. |
| 10,529,603 B2 | 1/2020 | Liang et al. |
| 10,566,188 B2 | 2/2020 | Clemons et al. |
| 10,622,214 B2 | 4/2020 | Wong et al. |
| 10,636,669 B2 | 4/2020 | Chen et al. |
| 10,636,677 B2 | 4/2020 | Delmas et al. |
| 10,636,704 B2 | 4/2020 | Mebarki et al. |
| 10,643,867 B2 | 5/2020 | Delmas et al. |
| 10,675,581 B2 | 6/2020 | Khan et al. |
| 10,685,830 B2 | 6/2020 | Delmas |
| 10,714,331 B2 | 7/2020 | Balseanu et al. |
| 10,720,341 B2 | 7/2020 | Liang et al. |
| 10,748,783 B2 | 8/2020 | Khan et al. |
| 10,790,183 B2 | 9/2020 | Sun et al. |
| 10,847,360 B2 | 11/2020 | Wong et al. |
| 10,854,483 B2 | 12/2020 | Schaller et al. |
| 10,916,433 B2 | 2/2021 | Ren et al. |
| 10,950,429 B2 | 3/2021 | Citla et al. |
| 10,957,533 B2 | 3/2021 | Jiang et al. |
| 11,018,032 B2 | 5/2021 | Delmas et al. |
| 11,101,174 B2 | 8/2021 | Jiang et al. |
| 2001/0016429 A1 | 8/2001 | Mak et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2001/0055649 A1 | 12/2001 | Ogure et al. |
| 2002/0066535 A1 | 6/2002 | Brown et al. |
| 2002/0073922 A1 | 6/2002 | Frankel et al. |
| 2002/0098715 A1 | 7/2002 | Lane et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2002/0155714 A1 | 10/2002 | Suzuki |
| 2002/0192056 A1 | 12/2002 | Reimer et al. |
| 2002/0197806 A1 | 12/2002 | Furukawa et al. |
| 2003/0022487 A1 | 1/2003 | Yoon et al. |
| 2003/0030945 A1 | 2/2003 | Heinonen et al. |
| 2003/0049372 A1 | 3/2003 | Cook et al. |
| 2003/0053893 A1 | 3/2003 | Matsunaga et al. |
| 2003/0059538 A1 | 3/2003 | Chung et al. |
| 2003/0101938 A1 | 6/2003 | Ronsse et al. |
| 2003/0121887 A1 | 7/2003 | Garvey et al. |
| 2003/0129832 A1 | 7/2003 | Fujikawa |
| 2003/0148035 A1 | 8/2003 | Lingampalli |
| 2003/0148631 A1 | 8/2003 | Kuo et al. |
| 2003/0194615 A1 | 10/2003 | Krauth |
| 2003/0207593 A1 | 11/2003 | Derderian et al. |
| 2003/0232512 A1 | 12/2003 | Dickinson et al. |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0097060 A1 | 5/2004 | San et al. |
| 2004/0112409 A1 | 6/2004 | Schilling |
| 2004/0180510 A1 | 9/2004 | Ranade |
| 2004/0184792 A1 | 9/2004 | Hamelin et al. |
| 2004/0219800 A1 | 11/2004 | Tognetti |
| 2004/0248392 A1 | 12/2004 | Narwankar et al. |
| 2004/0255979 A1 | 12/2004 | Fury et al. |
| 2005/0003655 A1 | 1/2005 | Cathey et al. |
| 2005/0014365 A1 | 1/2005 | Moon et al. |
| 2005/0022737 A1 | 2/2005 | Shimizu et al. |
| 2005/0051194 A1 | 3/2005 | Sakashita et al. |
| 2005/0074956 A1 | 4/2005 | Autryve et al. |
| 2005/0082281 A1 | 4/2005 | Uemori et al. |
| 2005/0109392 A1 | 5/2005 | Hollars |
| 2005/0136684 A1 | 6/2005 | Mukai et al. |
| 2005/0161158 A1 | 7/2005 | Schumacher |
| 2005/0164445 A1 | 7/2005 | Lin et al. |
| 2005/0186765 A1 | 8/2005 | Ma et al. |
| 2005/0191828 A1 | 9/2005 | Al-Bayati et al. |
| 2005/0198971 A1 | 9/2005 | Leitch et al. |
| 2005/0205210 A1 | 9/2005 | Devine et al. |
| 2005/0227479 A1 | 10/2005 | Feng et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0035035 A1 | 2/2006 | Sakama |
| 2006/0079086 A1 | 4/2006 | Boit et al. |
| 2006/0091493 A1 | 5/2006 | Wu |
| 2006/0105107 A1 | 5/2006 | Lindeboom et al. |
| 2006/0105515 A1 | 5/2006 | Amos et al. |
| 2006/0105557 A1 | 5/2006 | Klee et al. |
| 2006/0110934 A1 | 5/2006 | Fukuchi |
| 2006/0124613 A1 | 6/2006 | Kumar et al. |
| 2006/0128150 A1 | 6/2006 | Gandikota et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0240187 A1 | 10/2006 | Weidman |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0087533 A1 | 4/2007 | Nishikawa et al. |
| 2007/0095651 A1 | 5/2007 | Ye et al. |
| 2007/0111519 A1 | 5/2007 | Lubomirsky et al. |
| 2007/0116873 A1 | 5/2007 | Li et al. |
| 2007/0145416 A1 | 6/2007 | Ohta |
| 2007/0187386 A1 | 8/2007 | Kim et al. |
| 2007/0204797 A1 | 9/2007 | Fischer |
| 2007/0209931 A1 | 9/2007 | Miller |
| 2007/0212850 A1 | 9/2007 | Ingle et al. |
| 2007/0243317 A1 | 10/2007 | Du Bois et al. |
| 2007/0254471 A1 | 11/2007 | Kameyama et al. |
| 2007/0254477 A1 | 11/2007 | Muraoka et al. |
| 2007/0256559 A1 | 11/2007 | Chen et al. |
| 2008/0001196 A1 | 1/2008 | Cheng |
| 2008/0073691 A1 | 3/2008 | Konno et al. |
| 2008/0074658 A1 | 3/2008 | Davis et al. |
| 2008/0076230 A1 | 3/2008 | Cheng |
| 2008/0083109 A1 | 4/2008 | Shibata et al. |
| 2008/0085611 A1 | 4/2008 | Khandelwal et al. |
| 2008/0115726 A1 | 5/2008 | Ingle et al. |
| 2008/0121882 A1 | 5/2008 | Hwang et al. |
| 2008/0132050 A1 | 6/2008 | Lavoie |

(56) References Cited

U.S. PATENT DOCUMENTS

| | | |
|---|---|---|
| 2008/0210273 A1 | 9/2008 | Joe |
| 2008/0241384 A1 | 10/2008 | Jeong et al. |
| 2008/0251904 A1 | 10/2008 | Theuss et al. |
| 2008/0268635 A1 | 10/2008 | Yu et al. |
| 2008/0311711 A1 | 12/2008 | Hampp et al. |
| 2008/0315762 A1 | 12/2008 | Hamada et al. |
| 2009/0018688 A1 | 1/2009 | Chandler et al. |
| 2009/0029126 A1 | 1/2009 | Tanikawa |
| 2009/0035915 A1 | 2/2009 | Su |
| 2009/0035952 A1 | 2/2009 | Chua et al. |
| 2009/0053426 A1 | 2/2009 | Lu et al. |
| 2009/0053893 A1 | 2/2009 | Khandelwal et al. |
| 2009/0081884 A1 | 3/2009 | Yokota et al. |
| 2009/0087981 A1 | 4/2009 | Suzuki et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0183992 A1 | 7/2009 | Fredenberg et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2009/0246952 A1 | 10/2009 | Ishizaka et al. |
| 2009/0269507 A1 | 10/2009 | Yu et al. |
| 2009/0283735 A1 | 11/2009 | Li et al. |
| 2009/0298257 A1 | 12/2009 | Lee et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0032838 A1 | 2/2010 | Kikuchi et al. |
| 2010/0072569 A1 | 3/2010 | Han et al. |
| 2010/0102417 A1 | 4/2010 | Ganguli et al. |
| 2010/0173470 A1 | 7/2010 | Lee et al. |
| 2010/0173495 A1 | 7/2010 | Thakur et al. |
| 2010/0196626 A1 | 8/2010 | Choi et al. |
| 2010/0203725 A1 | 8/2010 | Choi et al. |
| 2010/0248419 A1 | 9/2010 | Woodruff et al. |
| 2010/0273324 A1 | 10/2010 | Lin et al. |
| 2010/0297854 A1 | 11/2010 | Ramamurthy et al. |
| 2010/0304027 A1 | 12/2010 | Lee et al. |
| 2010/0320459 A1 | 12/2010 | Umeda et al. |
| 2010/0323517 A1 | 12/2010 | Baker-O'Neal et al. |
| 2010/0327422 A1 | 12/2010 | Lee et al. |
| 2011/0011737 A1 | 1/2011 | Wu et al. |
| 2011/0048524 A1 | 3/2011 | Nam et al. |
| 2011/0124192 A1 | 5/2011 | Ganguli et al. |
| 2011/0151677 A1 | 6/2011 | Wang et al. |
| 2011/0163449 A1 | 7/2011 | Kelly et al. |
| 2011/0165781 A1 | 7/2011 | Liang et al. |
| 2011/0174363 A1 | 7/2011 | Munteanu |
| 2011/0198736 A1 | 8/2011 | Shero et al. |
| 2011/0204518 A1 | 8/2011 | Arunachalam |
| 2011/0233778 A1 | 9/2011 | Lee et al. |
| 2011/0237019 A1 | 9/2011 | Horng et al. |
| 2011/0240464 A1 | 10/2011 | Rasheed et al. |
| 2011/0263091 A1 | 10/2011 | Yamazaki |
| 2011/0303147 A1 | 12/2011 | Tachibana et al. |
| 2011/0305836 A1 | 12/2011 | Murata et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0100678 A1 | 4/2012 | Sako et al. |
| 2012/0112224 A1 | 5/2012 | Le Bellac et al. |
| 2012/0138146 A1 | 6/2012 | Furuhata et al. |
| 2012/0142192 A1 | 6/2012 | Li et al. |
| 2012/0142198 A1 | 6/2012 | Wang et al. |
| 2012/0153483 A1 | 6/2012 | Akolkar et al. |
| 2012/0175822 A1 | 7/2012 | Inamiya et al. |
| 2012/0252207 A1 | 10/2012 | Lei et al. |
| 2012/0252210 A1 | 10/2012 | Tohnoe |
| 2012/0258602 A1 | 10/2012 | Subramani et al. |
| 2012/0285492 A1 | 11/2012 | Lee et al. |
| 2012/0304485 A1 | 12/2012 | Hayashi et al. |
| 2012/0309190 A1 | 12/2012 | Kelly et al. |
| 2013/0068391 A1 | 3/2013 | Mazzocco et al. |
| 2013/0069174 A1 | 3/2013 | Chuang et al. |
| 2013/0194350 A1 | 8/2013 | Watanabe et al. |
| 2013/0233170 A1 | 9/2013 | Spiegelman et al. |
| 2013/0241037 A1 | 9/2013 | Jeong et al. |
| 2013/0256125 A1 | 10/2013 | Young et al. |
| 2013/0277760 A1 | 10/2013 | Lu et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0034632 A1 | 2/2014 | Pan et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0102877 A1 | 4/2014 | Yamazaki |
| 2014/0134827 A1 | 5/2014 | Swaminathan et al. |
| 2014/0138802 A1 | 5/2014 | Starostine et al. |
| 2014/0144462 A1 | 5/2014 | Verhaverbeke et al. |
| 2014/0159135 A1 | 6/2014 | Fujimoto et al. |
| 2014/0183743 A1 | 7/2014 | Matsumoto et al. |
| 2014/0213070 A1 | 7/2014 | Hong et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0273335 A1 | 9/2014 | Abushama |
| 2014/0284821 A1 | 9/2014 | Hubbard |
| 2014/0319129 A1 | 10/2014 | Ahmad |
| 2014/0319462 A1 | 10/2014 | Huang et al. |
| 2014/0322921 A1 | 10/2014 | Ahmad et al. |
| 2015/0000870 A1 | 1/2015 | Hosotani et al. |
| 2015/0021672 A1 | 1/2015 | Chuang et al. |
| 2015/0024592 A1 | 1/2015 | Chandrashekar et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0093891 A1 | 4/2015 | Zope et al. |
| 2015/0099342 A1 | 4/2015 | Tsai et al. |
| 2015/0144999 A1 | 5/2015 | Ching et al. |
| 2015/0145002 A1 | 5/2015 | Lee et al. |
| 2015/0159272 A1 | 6/2015 | Yoon et al. |
| 2015/0179501 A1 | 6/2015 | Jhaveri et al. |
| 2015/0197455 A1 | 7/2015 | Pranov |
| 2015/0203961 A1 | 7/2015 | Ha et al. |
| 2015/0255581 A1 | 9/2015 | Lin et al. |
| 2015/0279635 A1 | 10/2015 | Subramani et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0348824 A1 | 12/2015 | Kuenle et al. |
| 2015/0357195 A1 | 12/2015 | Lam et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0053366 A1 | 2/2016 | Stowell et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0093726 A1 | 3/2016 | Ching et al. |
| 2016/0111272 A1 | 4/2016 | Girard et al. |
| 2016/0111337 A1 | 4/2016 | Hatcher et al. |
| 2016/0118260 A1 | 4/2016 | Mebarki et al. |
| 2016/0118391 A1 | 4/2016 | Zhao et al. |
| 2016/0126104 A1 | 5/2016 | Shaviv et al. |
| 2016/0163540 A1 | 6/2016 | Liao et al. |
| 2016/0181414 A1 | 6/2016 | Huang et al. |
| 2016/0186363 A1 | 6/2016 | Merzaghi et al. |
| 2016/0204027 A1 | 7/2016 | Lakshmanan et al. |
| 2016/0208414 A1 | 7/2016 | Odawara et al. |
| 2016/0260526 A1 | 9/2016 | Otto |
| 2016/0268127 A1 | 9/2016 | Yamazaki |
| 2016/0273758 A1 | 9/2016 | Fujimura |
| 2016/0274454 A1 | 9/2016 | Beasley et al. |
| 2016/0284882 A1 | 9/2016 | Jang |
| 2016/0308048 A1 | 10/2016 | Ching et al. |

(56) References Cited

U.S. PATENT DOCUMENTS

| | | |
|---|---|---|
| 2016/0314964 A1 | 10/2016 | Tang et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1 | 11/2016 | Sun et al. |
| 2016/0336475 A1 | 11/2016 | Mackie et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0358815 A1 | 12/2016 | Yu et al. |
| 2016/0372319 A1 | 12/2016 | Zeng et al. |
| 2016/0377972 A1 | 12/2016 | Hofmann et al. |
| 2016/0379853 A1 | 12/2016 | Schaller et al. |
| 2016/0379854 A1 | 12/2016 | Vopat et al. |
| 2017/0005188 A1 | 1/2017 | Cheng et al. |
| 2017/0005204 A1 | 1/2017 | Hosoba et al. |
| 2017/0011932 A1 | 1/2017 | Pethe et al. |
| 2017/0053784 A1 | 2/2017 | Subramani et al. |
| 2017/0053946 A1 | 2/2017 | Matsuzaki et al. |
| 2017/0084487 A1 | 3/2017 | Chebiam et al. |
| 2017/0104062 A1 | 4/2017 | Bi et al. |
| 2017/0110616 A1 | 4/2017 | Dissanayake et al. |
| 2017/0117379 A1 | 4/2017 | Chen et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0200642 A1 | 7/2017 | Shaviv |
| 2017/0253968 A1 | 9/2017 | Yahata |
| 2017/0263702 A1 | 9/2017 | Chan et al. |
| 2017/0263773 A1 | 9/2017 | Yamazaki |
| 2017/0287842 A1 | 10/2017 | Fu et al. |
| 2017/0301767 A1 | 10/2017 | Niimi et al. |
| 2017/0314125 A1 | 11/2017 | Fenwick et al. |
| 2017/0317109 A1 | 11/2017 | Wang et al. |
| 2017/0358483 A1 | 12/2017 | Roy et al. |
| 2018/0003567 A1 | 1/2018 | Petry et al. |
| 2018/0019249 A1 | 1/2018 | Zhang et al. |
| 2018/0023192 A1 | 1/2018 | Chandra et al. |
| 2018/0033615 A1 | 2/2018 | Tjandra |
| 2018/0051368 A1 | 2/2018 | Liu et al. |
| 2018/0053725 A1 | 2/2018 | Edelstein et al. |
| 2018/0068890 A1 | 3/2018 | Zope et al. |
| 2018/0087418 A1 | 3/2018 | Cadigan et al. |
| 2018/0096847 A1 | 4/2018 | Thompson et al. |
| 2018/0096874 A1 | 4/2018 | Schaller et al. |
| 2018/0182856 A1 | 6/2018 | Lee |
| 2018/0209037 A1 | 7/2018 | Citla et al. |
| 2018/0240682 A1 | 8/2018 | Lai et al. |
| 2018/0258533 A1 | 9/2018 | Liang et al. |
| 2018/0261480 A1 | 9/2018 | Liang et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0337027 A1 | 11/2018 | L'Heureux et al. |
| 2018/0342384 A1 | 11/2018 | Wong et al. |
| 2018/0342396 A1 | 11/2018 | Along et al. |
| 2018/0350563 A1 | 12/2018 | Manna et al. |
| 2018/0366328 A1 | 12/2018 | Ren et al. |
| 2019/0019708 A1 | 1/2019 | Weaver et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0170591 A1 | 6/2019 | Petry et al. |
| 2019/0198367 A1 | 6/2019 | Liang |
| 2019/0198368 A1 | 6/2019 | Weaver et al. |
| 2019/0228982 A1 | 7/2019 | Chen et al. |
| 2019/0229004 A1 | 7/2019 | Schaller et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0259638 A1 | 8/2019 | Schaller et al. |
| 2019/0279879 A1 | 9/2019 | Singh et al. |
| 2019/0311896 A1 | 10/2019 | Balseanu et al. |
| 2019/0326138 A1 | 10/2019 | Forderhase et al. |
| 2019/0360100 A1 | 11/2019 | Nguyen et al. |
| 2019/0360633 A1 | 11/2019 | Schaller et al. |
| 2019/0368035 A1 | 12/2019 | Malik et al. |
| 2019/0371650 A1 | 12/2019 | Sun et al. |
| 2019/0375105 A1 | 12/2019 | Weaver et al. |
| 2020/0035509 A1 | 1/2020 | Khan et al. |
| 2020/0035513 A1 | 1/2020 | Khan et al. |
| 2020/0075392 A1 | 3/2020 | Brown et al. |
| 2020/0098574 A1 | 3/2020 | Wong et al. |
| 2021/0167235 A1 | 6/2021 | Li et al. |

FOREIGN PATENT DOCUMENTS

| | | |
|---|---|---|
| CN | 104047676 A | 9/2014 |
| CN | 104089491 A | 10/2014 |
| CN | 103035513 B | 10/2016 |
| EP | 0516344 A1 | 12/1992 |
| EP | 0670590 A2 | 9/1995 |
| EP | 1069213 A2 | 1/2001 |
| EP | 110728 A2 | 6/2001 |
| EP | 0840365 A3 | 10/2003 |
| JP | 03-004616 | 1/1988 |
| JP | S6367721 A | 3/1988 |
| JP | H1218018 A | 8/1989 |
| JP | H04355922 A | 12/1992 |
| JP | H0521347 A | 1/1993 |
| JP | 06-283496 | 10/1994 |
| JP | H07048489 B2 | 5/1995 |
| JP | H07158767 A | 6/1995 |
| JP | H08195493 A | 7/1996 |
| JP | H09048690 A | 2/1997 |
| JP | H9296267 A | 11/1997 |
| JP | H10214880 A | 8/1998 |
| JP | H10335657 A | 12/1998 |
| JP | H11209872 A | 8/1999 |
| JP | H11-354515 | 12/1999 |
| JP | 2000221799 A | 8/2000 |
| JP | 2000357699 A | 12/2000 |
| JP | 2001053066 A | 2/2001 |
| JP | 2001110729 A | 4/2001 |
| JP | 2001274161 A | 10/2001 |
| JP | 2003-51474 A | 2/2003 |
| JP | 2003166065 A | 6/2003 |
| JP | 2003188387 A | 7/2003 |
| JP | 2004127958 A | 4/2004 |
| JP | 2005-79528 A | 3/2005 |
| JP | 2005064269 A | 3/2005 |
| JP | 2005530343 A | 10/2005 |
| JP | 2005-333015 A | 12/2005 |
| JP | 2006526125 A | 11/2006 |
| JP | 2007242791 A | 9/2007 |
| JP | 2008/073611 A | 4/2008 |
| JP | 2008118118 A | 5/2008 |
| JP | 2008153635 A | 7/2008 |
| JP | 2009-129927 A | 6/2009 |
| JP | 2009-539231 A | 11/2009 |
| JP | 201080949 A | 4/2010 |
| JP | 2010168607 A | 8/2010 |
| JP | 2010-205854 A | 9/2010 |
| JP | 2011-29394 A | 2/2011 |
| JP | 2011258943 A | 12/2011 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| JP | 2014103351 A | 6/2014 |
| JP | 2015067884 A | 4/2015 |
| JP | 2015086459 A | 5/2015 |
| JP | 2015115394 A | 6/2015 |
| JP | 2015-233157 A | 12/2015 |
| KR | 19980063671 A | 10/1998 |
| KR | 20010046843 A | 6/2001 |
| KR | 20030052162 A | 6/2003 |

(56) References Cited

FOREIGN PATENT DOCUMENTS

| | | |
|---|---|---|
| KR | 100422433 B1 | 7/2004 |
| KR | 10-20040068969 A | 8/2004 |
| KR | 20050121750 A | 12/2005 |
| KR | 100684910 B1 | 2/2007 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 | 9/2013 |
| KR | 101305904 B1 | 9/2013 |
| KR | 20140003776 A | 1/2014 |
| KR | 20140104112 A | 8/2014 |
| KR | 101438291 B1 | 9/2014 |
| KR | 20140135744 A | 11/2014 |
| KR | 20150006587 A | 1/2015 |
| KR | 20150122432 A | 11/2015 |
| KR | 20160044004 A | 4/2016 |
| KR | 20160061437 A | 5/2016 |
| NO | 2010115128 A3 | 1/2011 |
| NO | 2015195081 A1 | 12/2015 |
| TW | 200529284 A | 9/2005 |
| TW | 200721316 A | 6/2007 |
| TW | 201507174 A | 2/2015 |
| TW | 201608672 A | 3/2016 |
| TW | 201708597 A | 3/2017 |
| WO | 2000/51938 A1 | 9/2000 |
| WO | 03023827 A1 | 3/2003 |
| WO | 2004102055 A1 | 11/2004 |
| WO | 2005057663 A2 | 6/2005 |
| WO | 2008047886 A1 | 4/2008 |
| WO | 2008/089178 A2 | 7/2008 |
| WO | 2011002058 A1 | 1/2011 |
| WO | 2011/103062 A2 | 8/2011 |
| WO | 2012/133583 A1 | 10/2012 |
| WO | 2014115600 A1 | 7/2014 |
| WO | 2016/018593 A1 | 2/2016 |
| WO | 20161018593 | 2/2016 |
| WO | 2016065219 A1 | 4/2016 |
| WO | 2016111833 A1 | 7/2016 |
| WO | 2018187546 A1 | 10/2018 |

OTHER PUBLICATIONS

International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/015339 dated May 15, 2019.
International Search Report and Written Opinion for PCT/US2019/015332 dated May 15, 2019.
Taiwan Office Action dated Jun. 11, 2019 for Application No. 107138905.
Haskel Pressure on Demand, Pneumatic and Hydraulic Driven Gas Boosters, Apr. 30, 2016, 36 pp.
International Search Report and Written Opinion for PCT/US2018/059676 dated May 23, 2019.
International Search Report and Written Opinion for PCT/US2019/023431 dated Jul. 5, 2019.
Taiwan Office Action dated July 3, 2019 for Application No. 107136151.
International Search Report and Written Opinion for PCT/US2018/021715 dated Jun. 22, 2018.
International Search Report and Written Opinion for International Application No. PCT/US2019/029602 dated Aug. 14, 2019.
Office Action for Japanese Application No. 2018-546484 dated Oct. 8, 2019.
International Search Report and Written Opinion for International Application No. PCT/US2019/040195 dated Oct. 25, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
International Search Report and Written Opinion for PCT/US2018/050464 dated Jan. 4, 2019.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
TW Application No. 107121254, Office Action dated May 4, 2020.
Taiwan Office Action dated Oct. 12, 2020 for Application No. 108140559.
Office Action for Japanese Application No. 2019-548976 dated Oct. 20, 2020.
European International Search Report issued to 18764622.9 dated Nov. 20, 2020.
Office Action for Korean Application No. 10-2019-7029776 dated Jan. 18, 2021.
International Search Report and Written Opinion dated Jan. 31, 2019 for Application No. PCT/US2018/043160.
Taiwan Office Action dated May 4, 2020 for Application No. 107121254.
Japanese Office Action dated Feb. 16, 2021 for Application No. 2019-564964.
Extended European International Search Report issued to 18831823.2 dated Mar. 19, 2021.
Office Action for Japanese Patent Application No. 2020-500629 dated Jun. 8, 2021.
Extended European Search Report for EP Application No. 18876650.5 dated Jul. 19, 2021.
Extended European Search Report for EP Application No. 18806169.1 dated Jul. 19, 2021.
"Nternational Search Report and Written Opinion for PCT/US2019/056447 dated Feb. 7, 2020".

(56) References Cited

OTHER PUBLICATIONS

Office Action for Japanese Appiication No. 2018-517285 dated Oct. 23, 2019.
International Search Report, Application No. PCT/US2018/028258 dated Aug. 9, 18.
Lee, Ho-Saeng et al.,"The cooling heat transfer characteristics of the supercritical C02 in mico-fin tube", Springer, Oct. 2, 2012, pp. 173-184.
International Search Report and Written Opinion for PCT/US2019/014 759 dated May 14, 2019.
Taiwan Office Action dated Jul. 3, 2019 for Application No. 107136181.
Office Action for U.S. Appl. No. 16/510,847 dated Apr. 22, 2020.
Office Action for Korean Application No. 10-2020-7004396 dated Apr. 5, 2021.
Japanese Office Action dated Apr. 20, 2021 for Application No. JP 2020-508603.
Korean Office Action issued to Application No. 10-2019-7038099 dated May 1, 2021.
Office Action for Japanese Patent Application No. 2019-548976 dated May 25, 2021.
Korean Office Action dated Jul. 16, 2021 for Application No. 10-2020-7007956.
Office Action for Japanese Patent Application No. 2020-543976 dated Jul. 13, 2021.
Taiwan Office Action dated Jul. 28, 2021 for Application No. 107108016.
International Search Report and Written Opinion for International Application No. PCT/US2019/032609 dated Sep. 11, 2019.
Lin, Kevin L. et al.—"Nickel silicide for interconnects", 2015 IEEE International Interconnect Technology Conference and 2015 IEEE Materials for Advanced Metallization Conference (IITC/MAM), IEEE, (XP032808874), May 18, 2015, pp. 169-172.
EPO Extended European Search Report dated Aug. 9, 2019, for European Patent Application No. 19166775.7.
Japanese Office Action dated Mar. 17, 2020, for Japanese Patent Application No. 2019-073230.
Taiwan Office Action dated Mar. 31, 2020, for Taiwan Patent Application No. 108111883.
Korean Office Action dated Aug. 4, 2020, for Korean Patent Application No. 10-2019-0040236.
Japanese Office Action dated Nov. 10, 2020, for Japanese Patent Application No. 2019-073230.
T. Miyake et al., "Effects of atomic hydrogen on Cu reflow process", AIP Conferenec Proceedings 418,419 (1998).
International Search Report and Written Opinion dated Aug. 24, 2017 for Application No. PCT/US2017/033862.
Taiwan Office Action for Application No. 106119184 dated Mar. 6, 2019.
Japanese Office Action for Application No. 2018-564195 dated Nov. 19, 2019.
PCT Notification of Transmittal of the International Search Report and the Written Opinion of the International Searching Authority for International Application No. PCT/US2019/061995; dated Mar. 9, 2020; 13 total pages.
International Search Report PCT/2020/046396 dated Nov. 26, 2020 consists of 12 pages.
International Search Report and Written Opinion for PCT/US2021/014991 dated May 17, 2021.
Korean Office Action dated Aug. 26, 2021, for Korean Patent Application No. 10-2020-4016526.

GAS DELIVERY MODULE

CROSS-REFERENCE TO RELATED APPLICATIONS

This application is a continuation of U.S. patent application Ser. No. 16/510,847, filed Jul. 12, 2019, which claims benefit of U.S. Provisional Patent Application No. 62/703,251, filed Jul. 25, 2018, both of which are herein incorporated by reference in their entirety.

BACKGROUND

Field

Embodiments of the present disclosure generally relate to apparatus for semiconductor processing. More specifically, embodiments of the disclosure relate to a high pressure gas delivery module.

Description of the Related Art

The field of semiconductor manufacturing utilizes various processes to fabricate devices which are incorporated into integrated circuits. As device complexity increases, integrated circuit manufacturers look for improved methodologies to fabricate advanced node devices. For example, advanced processing characteristics may include the utilization of more extreme process variables to enable advanced device fabrication.

One example of a process variable which is increasingly being investigated for utilization in semiconductor manufacturing is high pressure processing. High pressure processing at pressures elevated above atmospheric pressure has shown promising material modulation characteristics. However, apparatus suitable for safely and efficiently performing high pressure processing is often lacking when considering the requisite degree of control desired to perform advanced node device fabrication processes.

Accordingly, what is needed in the art are improved high pressure processing apparatus and methods for performing high pressure processing.

SUMMARY

In one embodiment, a high pressure processing apparatus is provided. The apparatus includes a first chamber body defining a first volume therein. A second chamber body is disposed within the first volume and the second chamber body defines a second volume therein. A fluid delivery module is in fluid communication with the second volume. The fluid delivery module includes a first reservoir, a first conduit extending between the first reservoir and the second volume, a flow regulator disposed on the first conduit, a second reservoir in fluid communication with a plurality of gas pumps, and a second conduit extending between the second reservoir and the second volume.

In another embodiment, a high pressure processing apparatus is provided. The apparatus includes an enclosure defining a volume therein and a first reservoir disposed within the volume. The first reservoir includes a fluid inlet port, a first fluid outlet port, and a second fluid outlet port. A second reservoir is disposed within the volume and the second reservoir includes a fluid inlet port and a fluid outlet port. The apparatus further includes a first gas pump, a second gas pump disposed between the first gas pump and the second reservoir, and a conduit extending between the second gas pump and the second reservoir.

In yet another embodiment, a high pressure processing apparatus is provided. The apparatus includes a first chamber body defining a first volume therein, a first slit valve door coupled to an external surface of the first chamber body, a second chamber body disposed within the first volume, the second chamber body defining a second volume therein, and a second slit valve door coupled to an interior surface of the second chamber body. A fluid delivery module is in fluid communication with the second volume via a plurality of conduits. The fluid delivery module includes a first reservoir in fluid communication with the second volume via a first conduit of the plurality, a second reservoir fabricated from a nickel containing steel alloy in fluid communication with the second volume via a second conduit, a first gas pump fabricated from the nickel containing steel alloy, and a second gas pump fabricated from the nickel containing steel alloy. The second gas pump is in fluid communication with each of the first gas pump and the second reservoir.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to high pressure processing apparatus for semiconductor processing. The apparatus described herein include a high pressure process chamber and a containment chamber surrounding the process chamber. A high pressure fluid delivery module is in fluid communication with the high pressure process chamber and is configured to deliver a high pressure fluid to the process chamber.

Figure 1:
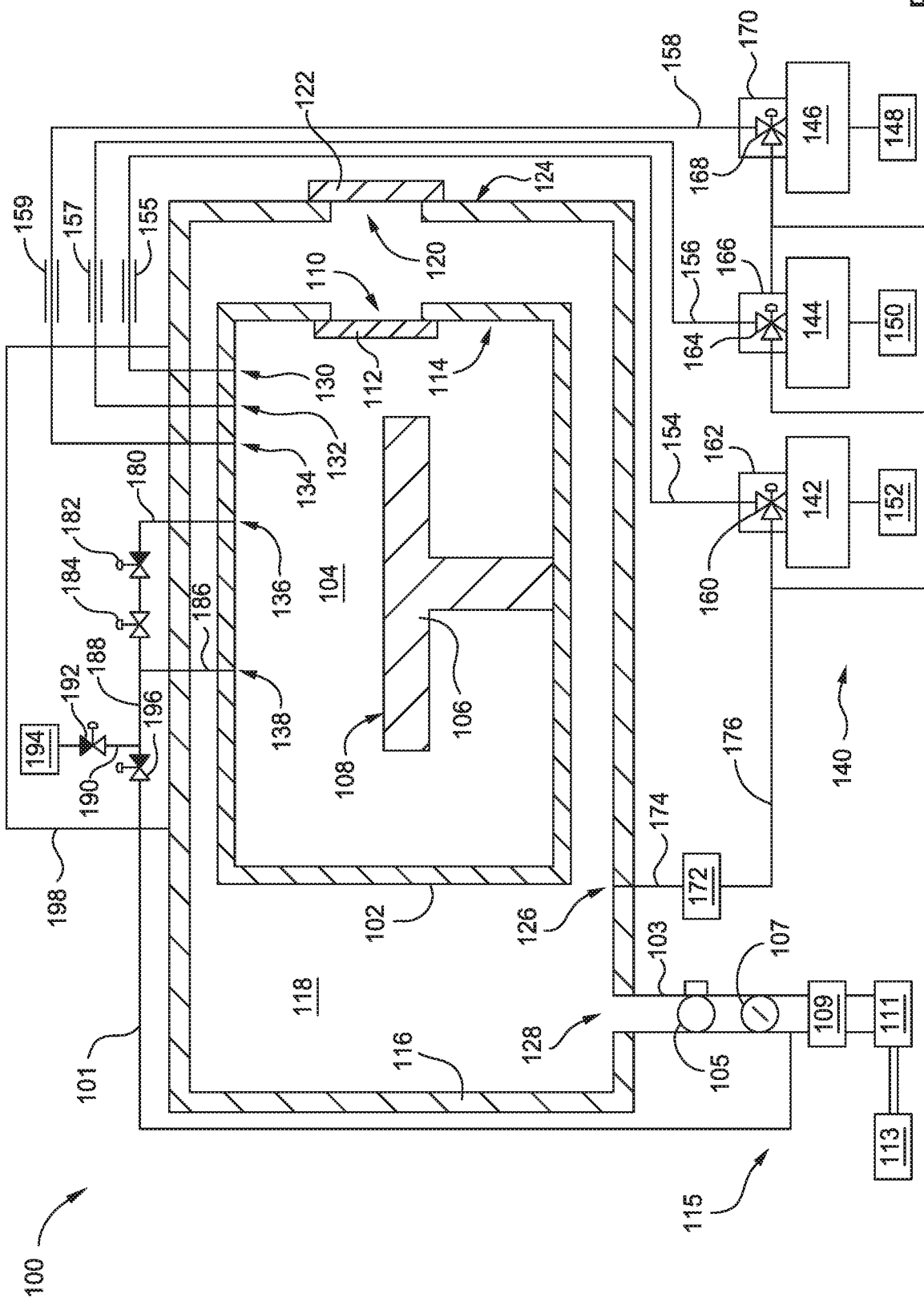
FIG. 1 is a schematic illustration of a high pressure processing apparatus according to an embodiment described herein.

FIG. 1 is a schematic illustration of a high pressure processing apparatus 100 according to an embodiment described herein. The apparatus 100 includes a first chamber 116 which defines a first volume 118 therein. In one embodiment, a volume of the first volume 118 is between about 80 liters and about 150 liters, for example, between about 100 liters and about 120 liters. The first chamber 116 is fabricated from a process compatible material, such as aluminum, stainless steel, alloys thereof, and combinations thereof. In one embodiment, the first chamber 116 is fabricated from a nickel containing steel alloy, for example, a nickel molybdenum containing steel alloy or a nickel chromium molybdenum containing steel alloy. The material selected for fabrication of the first chamber 116 is suitable for operation at sub-atmospheric pressures, for example pressures less than about 700 Torr, such as 650 Torr or less.

The first chamber 116 has an exhaust port 128 formed therein. An exhaust conduit 103 is coupled to the first chamber 116 at the exhaust port 128 such that the exhaust conduit 103 is in fluid communication with the first volume 118. An isolation valve 105 and a throttle valve 107 are disposed on the exhaust conduit 103. The isolation valve 105 is disposed on the exhaust conduit 103 between the throttle valve 107 and the exhaust port 128. The isolation valve 105 is operable to initiate and extinguish fluid communication between the first volume 118 and an exhaust 113. The throttle valve 107 controls a flow rate of effluent flowing through the exhaust conduit 103 from the first volume 118.

A pump 109 is also coupled to the exhaust conduit 103 and the pump 109 operates to pull fluid from the first volume 118 to the exhaust 113. The pump 109 is disposed on exhaust conduit 103 between the throttle valve 107 and the exhaust 113. In one embodiment, the pump 109 generates a sub-atmospheric pressure in the first volume 118, such as a pressure less than about 700 Torr. A scrubber 111 is also disposed on the exhaust conduit 103 between the pump 109 and the exhaust 113. The scrubber 111 is in fluid communication with the first volume 118 via the exhaust conduit 103 and the scrubber 111 is configured to treat effluent from the first volume 118 prior to the effluent exiting the exhaust conduit 103 to the exhaust 113.

The first chamber 116 has an external surface 124 which is not exposed to the first volume 118. A first slit valve 120 is formed in the chamber 116 to enable ingress and egress of a substrate therethrough. A first slit valve door 122 is coupled to the external surface 124 adjacent to the first slit valve 120. In operation, the first slit valve door 122 is opened to enable passage of the substrate therethrough and closes prior to processing of the substrate.

A second chamber 102 is disposed within the first volume 118 defined by the first chamber 116. The second chamber 102 defines a second volume 104 therein. Similar to the first chamber 116, the second chamber 102 is fabricated from a process compatible material, such as aluminum, stainless steel, alloys thereof, and combinations thereof. In one embodiment, the second chamber 102 is fabricated from a nickel containing steel alloy, for example, a nickel molybdenum containing steel alloy or a nickel chromium molybdenum containing steel alloy. The material selected for fabrication of the second chamber 102 is suitable for operation of the second volume 104 at high pressures, such as greater than about 30 bar, for example, about 50 bar or greater.

A pedestal 106 is disposed in the second chamber 102 and the pedestal 106 has a substrate support surface 108 for supporting a substrate thereon during processing. In one embodiment, the pedestal 106 includes a resistive heater operable of maintaining a temperature of a substrate disposed on the substrate support surface 108 at a temperature of up to about 550° C. Although not illustrated, a stem of the pedestal 106 extends through the second chamber 102 and the first chamber 116. The stem of the pedestal 106 may be isolated from the first volume 118 by a bellows assembly which is operable isolate the pedestal 106 from the first volume 118.

A second slit valve 110 is formed through the second chamber 102 to enable ingress and egress of the substrate therethrough. The second slit valve 110 is substantially aligned in approximately the same plane as the first slit valve 120. A second slit valve door 112 is coupled to an internal surface 114 of the second chamber 102 adjacent to the second slit valve 110. The positioning of the second slit valve door 112 on the internal surface 114 enables more secure sealing of the second volume 104 during high pressure processing because the high pressure maintained within the second volume 104 urges the second slit valve door 112 against the internal surface 114 to create a substantially air tight seal. In operation, the second slit valve door 112 is opened to enable passage of the substrate from the first slit valve 120. After the substrate is positioned on the substrate support surface 108 of the pedestal 106, the second slit valve door 112 closes prior to processing of the substrate.

A fluid management apparatus 140 is configured to deliver one or more fluids to the second volume 104 of the second chamber 102. The fluid management apparatus 140 includes a first fluid delivery module 144, a second fluid delivery module 142, and a third fluid delivery module 146. The first fluid delivery module 144 is operable to generate steam and deliver steam to the second volume 104. The first fluid delivery module 144 is in fluid communication with a first fluid source 150. In one embodiment, the first fluid source 150 is a water source, and more specifically, a deionized water source. The second fluid delivery module 142 is in fluid communication with a second fluid source 152. In one embodiment, the second fluid source 152 is a hydrogen source, and more specifically, an $H_2$ source. The third fluid delivery module 146 is in fluid communication with a third fluid source 148. In one embodiment, the third fluid source 148 is a nitrogen gas source, for example, an ammonia source.

The first fluid delivery module 144 is in fluid communication with the second volume 104 via a first conduit 156. A valve 164 is disposed between the first fluid delivery module 144 and the first conduit 156. The valve 164 is operable to enable fluid flow from the first fluid delivery module 144 through the first conduit 156. A containment enclosure 166 surrounds the valve 164 and the connections of the valve 164 between the first fluid delivery module 144 and the first conduit 156. The first conduit 156 extends from the first valve 164 through the first chamber 116, the first volume 118, and the second chamber 102 to a port 132 formed on the internal surface 114 of the second chamber 102. In one embodiment, a heater jacket 157 surrounds the first conduit 156 and extends along a length of the first conduit 156 between the valve 164 and the first chamber 116.

The second fluid delivery module 142 is in fluid communication with the second volume 104 via a second conduit 154. A valve 160 is disposed between the second fluid delivery module 142 and the second conduit 154. The valve 160 is operable to enable fluid flow from the second fluid delivery module 142 through the second conduit 154. A containment enclosure 162 surrounds the valve 160 and the connections of the valve 160 between the second fluid delivery module 142 and the second conduit 154. The second conduit 154 extends from the second valve 160 through the first chamber 116, the first volume 118, and the second chamber 102 to a port 130 formed on the internal surface 114 of the second chamber 102. In one embodiment, a heater jacket 155 surrounds the second conduit 154 and extends along a length of the second conduit 154 between the valve 160 and the first chamber 116.

The third fluid delivery module 146 is in fluid communication with the second volume 104 via a third conduit 158. A valve 168 is disposed between the third fluid delivery module 146 and the third conduit 158. The valve 168 is operable to enable fluid flow from the third fluid delivery module 146 through the third conduit 158. A containment enclosure 170 surrounds the valve 168 and the connections of the valve 168 between the third fluid delivery module 146 and the third conduit 158. The third conduit 158 extends from the third valve 168 through the first chamber 116, the first volume 118, and the second chamber 102 to a port 134 formed on the internal surface 114 of the second chamber 102. In one embodiment, a heater jacket 159 surrounds the third conduit 158 and extends along a length of the third conduit 158 between the valve 168 and the first chamber 116.

Each of the heater jackets 155, 157, 159 are operable to maintain a temperature of a respective conduit 154, 156, 158 at about 300° C. or greater, for example. 350° C. or greater. In one embodiment the heater jackets 155, 157, 159 comprise resistive heaters. In another embodiment, the heater jackets 155, 157, 159 comprise fluid channels though which a heated fluid is flowed. By maintaining the conduits 154, 156, 158 at elevated temperatures, steam and other high pressure fluids maintain desirable property characteristics during transfer from the respective fluid delivery modules 142, 144, 146 to the second volume 104. In one example, steam generated in the fluid delivery module 144 is maintained in the conduit 156 at elevated temperatures by the heater jacket 157 to prevent or substantially reduce the probability of condensation during steam transfer.

The apparatus 100 also includes a purge gas source 172. In one embodiment, the purge gas source 172 is an inert gas source, such as a nitrogen source or a noble gas source. The purge gas source 172 is in fluid communication with the first volume 118. A conduit 174 extends from the purge gas source 172 to a port 126 formed in the first chamber 116. The fluid communication between the purge gas source 172 and the first volume 118 enables the first volume 118 to be purged with an inert gas. It is contemplated that the first volume 118 is a containment volume that functions as a failsafe should the second volume 104 experience an unplanned depressurization event. By having a sufficiently large volume to function as an expansion volume and by having purge gas capability, the first volume 118 enables improved safety of operation of the second chamber 102 at elevated pressures.

The purge gas source 172 is also in fluid communication with each of the conduits 156, 154, 158. A conduit 176 extends from the purge gas source 172 to each of the valves 160, 164, 168. When the valves 160, 164, 168 are opened to receive purge gas from the purge gas source 172 flowing through the conduit 176, the conduits 154, 156, 158 are purged to eliminate fluids in the conduits 154, 156, 158 that were previously delivered from the fluid delivery modules 142, 144, 146. The fluid communication between the purge gas source 172 and the conduits 154, 156, 158 also enables purging of the second volume 104.

To remove fluids from the second volume 104, an exhaust port 136 is formed in the second chamber 102. A conduit 180 extends from the exhaust port 136 to a regulator valve 184 which is configured to enable a pressure drop across the regulator valve 184. In one embodiment, pressurized fluid exhausted from the second volume 104 travels through the exhaust port 136, through the conduit 180, and through a valve 182 to the regulator valve 184 where a pressure of the fluid is reduced from greater than about 30 bar, such as about 50 bar, to between about 0.5 bar to about 3 bar. The valve 182 is disposed inline with the regulator valve 184 and enables transfer of the reduced pressure fluid from the conduit 180 to a conduit 188.

A pressure relief port 138 is also formed in the second chamber 102. A conduit 186 extends from the pressure relief port 138 to the conduit 188 and the conduit 186 is coupled to the conduit 188 downstream of the regulator valve 184 and the valve 182. The pressure relief port 138 and conduit 186 are configured to bypass the regulator valve 184 and function as a secondary pressure reduction for the second volume 104. A valve 196 is disposed on the conduit 188 downstream from the conduit 186, the regulator valve 184, and the valve 182. The valve 196 functions to enable fluid flow from the second volume 104 via the pressure relief port 138 without passing through the regulator valve 184. Accordingly, the second volume 104 has a bifurcated pressure relief architecture, first through the exhaust port 136, the conduit 180, and the regulator valve 184, and second, through the pressure relief port 138 and the conduit 186. It is believed that the bifurcated pressure relief architecture enables improved control of the pressures generated in the second volume 104.

A conduit 190 is coupled to and extends from the conduit 188 between the valve 184 and the valve 196. More specifically, the conduit 190 is coupled to the conduit 188 downstream of a location where the conduit 186 is coupled to the conduit 188. A valve 192 is disposed on the conduit 190 and is operable to enable selective fluid communication between the second volume 104 and a steam trap 194. The steam trap 194 is configured to condense steam released from the second volume 104 when high pressure steam processes are performed in the second volume 104. In one embodiment, the steam trap 194 is in fluid communication with the second volume 104 via the conduits 190, 188, and 186 when the valve 192 is opened and the valve 182 is closed. The steam trap 194 may also function as a secondary pressure reduction apparatus for high pressure steam released from the second volume 104.

A containment enclosure 198 is coupled to the first chamber 116 and each of the regulator valve 184, the valve 182, the valve 196, and the valve 192 are disposed within the containment enclosure 198. The conduits 188, 190 are disposed within the containment enclosure 198 and at least a portion of each of the conduits 180, 186 is disposed within the containment enclosure 198. In one embodiment, the steam trap 194 is disposed within the containment enclosure 198. In another embodiment, the steam trap 194 is disposed outside of the containment enclosure 198. The containment enclosure 198 is configured to isolate and contain any leakage of effluent exhausted from the second volume 104. Although not illustrated, the containment enclosure 198 volume is in fluid communication with the scrubber 111 to enable treatment of effluent constrained within the containment enclosure 198.

When the valve 196 is opened, fluid from the conduit 188 travels to a conduit 101 which is in fluid communication with the exhaust conduit 103. The conduit 101 extends form the valve 196 to the exhaust conduit 103 and couples to the exhaust conduit 103 between the throttle valve 107 and the pump 109. Thus, fluid from the second volume 104 which travels through the conduit 101 enters the exhaust conduit 103 upstream from the pump 109 and is subsequently treated by the scrubber 111 prior to exiting to the exhaust 113.

Figure 2:
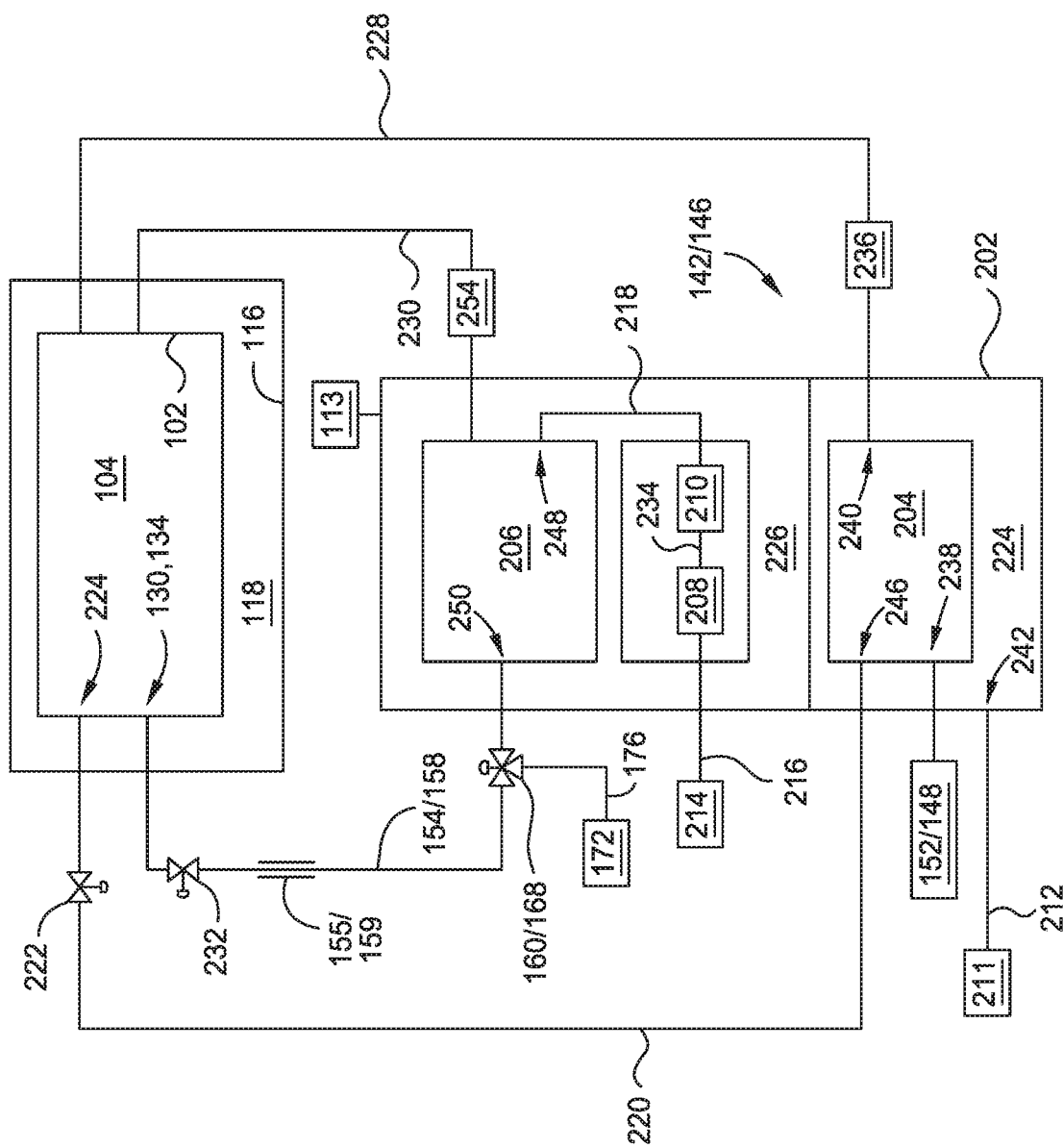
FIG. 2 is a schematic illustration of a fluid delivery module according to an embodiment described herein.

FIG. 2 is a schematic illustration of the fluid delivery module 142/146 according to an embodiment described herein. In one embodiment, the fluid delivery module 142/146 is configured to generate and deliver a low pressure fluid and a high pressure fluid to the second volume 104. The fluid delivery module 142/146 includes a first reservoir 204 and a second reservoir 206. In one embodiment, the first reservoir 204 is a low pressure chemical delivery apparatus which delivers one or more liquid precursors to the second volume 104. In one embodiment, the first reservoir 204 maintains one or more precursors at a sub-atmospheric pressure prior to delivery of the precursors to the second volume 104. The second reservoir 206 is configured to maintain pressurization of a pressurized fluid when the pressurized fluid is delivered to the second reservoir 206.

In one embodiment, the first reservoir 204 and the second reservoir 206 are fabricated from similar materials. For example, the first reservoir 204 and the second reservoir 206 are fabricated from a nickel containing steel alloy. In one embodiment, the first reservoir 204 and the second reservoir 206 are fabricated from a nickel containing steel alloy comprising molybdenum. In another embodiment, the first reservoir 204 and the second reservoir 206 are fabricate from a nickel containing steel alloy comprising chromium. In another embodiment, both of the first reservoir 204 and the second reservoir 206 are fabricated from a stainless steel containing material. In another embodiment, the materials selected for the first reservoir 204 and the second reservoir 206 are different. For example, the first reservoir 204 is fabricated from an aluminum material, a stainless steel material, or alloys thereof and the second reservoir 206 is fabricated from one of the aforementioned nickel containing steel alloys.

The material selected for the second reservoir 206 is highly corrosion resistant to the precursors which are maintained therein at an elevated pressure. One example of precursors which are maintained at elevated (supra-atmospheric) pressure is ammonia. It is also contemplated that various other precursor materials may be utilized in accordance with the embodiments described herein. The materials selected for the first reservoir 204 and the second reservoir 206 are also contemplated to provide sufficient mechanical integrity to enable generation and maintenance of elevated or reduced pressures therein. The first reservoir 204 is operable at temperatures less than about 300° C., for example, less than about 200° C. The second reservoir 206 is operable at temperatures greater than about 250° C., such as temperatures up to about 450° C.

The fluid delivery module 142/146 includes a containment structure 202. In one embodiment, the first reservoir 204 and the second reservoir 206 are disposed within the containment structure 202 in a single volume. In another embodiment, the containment structure 202 is divided to form separate regions therein, for example, a first region 224 and a second region 226. In one embodiment, the first reservoir 204 is disposed in the first region 224 and the second reservoir 206 is disposed in the second region 226. It is contemplated that the regions 224, 226 may either be in fluid communication with one another or may be fluidly isolated from one another, depending upon the containment characteristics desired.

A purge gas source 211 is coupled to a conduit 212 which extends between the purge gas source 211 to a port 242 formed in the containment structure 202. The port 242 is formed in the containment structure 202 adjacent to the first region 224. In one embodiment, the purge gas source 211 is operable to deliver a purge gas, such an $N_2$ or a noble gas, to the first region 224. In one embodiment, the first region 224 and the second region 226 are in fluid communication with one another and the purge gas source 211 is operable to deliver a purge gas to both the first region 224 and the second region 226. In another embodiment, the purge gas source 211 is in fluid communication with the first reservoir 204. The conduit 212 may be coupled directly or indirectly to the port 242 to enable fluid communication between the purge gas source 211 and the first reservoir 204. In this embodiment, the purge gas source 211 is operable to deliver an inert gas to the first reservoir 204 to purge the first reservoir 204 and remove effluent therefrom. Purge gas from the first reservoir 204 may also be utilized to flush conduit 220 which are coupled to and in fluid communication with the first reservoir 204.

The exhaust 113 is in fluid communication with the second region 226 of the containment structure 202. In one embodiment, fluids existing in the second region 226 outside of the second reservoir 206 are exhausted from the second region 226 to the exhaust 113. In embodiments where the first region 224 and the second region 226 are in fluid communication with one another, fluids from both the first region 224 and the second region 226 are capable of being removed from the regions 224, 226 by the exhaust 113.

The fluid sources 148, 152 are coupled to and in fluid communication with a port 238 formed in the first reservoir 204. In one embodiment, the fluid sources 148, 152 are operable to deliver one or more fluids to the first reservoir 204. In one embodiment, the fluid sources 148, 152 are operable to deliver a liquid precursor to the first reservoir 204. In another embodiment, the fluid sources 148, 152, are operable to deliver a gaseous precursor to the first reservoir 204. In one embodiment, the fluid sources 148, 152 deliver a hafnium containing material, a titanium containing material, or a combination thereof to the first reservoir 204. In one embodiment, the materials delivered from the first reservoir 204 to the second volume 104 are configured to coat surfaces of the second chamber 102.

The first reservoir 204 has a port 240 formed therein which is coupled to a conduit 228. The conduit 228 extends to the second volume 104 and a flow rate controller 236 is disposed inline with the conduit 228. The flow rate controller 236 is operable to control a flow rate of fluid exiting the port 240 and flowing through the conduit 228 to the second volume 104. A port 246 is also formed in the first reservoir 204. A conduit 220 is coupled to the port 246. The conduit 220 extends from the port 246 to the second volume 104. A valve 222 is disposed on the conduit 220 which is operable to enable fluid communication between the first reservoir 204 and the second volume 104.

In one embodiment, both of the conduits 220, 228 are in fluid communication between the first reservoir 204 and the second volume 104. In one embodiment, the conduits 220, 228 enter the second volume 104 opposite one another. In another embodiment, one or both of the conduits 220, 228 are coupled to a showerhead (not illustrated) disposed in the second volume 104 and the showerhead distributes fluid delivered from the first reservoir 204 throughout the second volume 104.

A first gas pump 208 and a second gas pump 210 are disposed in the second region 226. The first gas pump 208 and the second gas pump 210 are operable to generate a staged pressure increase of a gas to be maintained in the second reservoir 206. In one embodiment, the first gas pump 208 and the second gas pump 210 are positioned in series to decrease a ramp time associated with pressurization of a fluid (i.e. gas) to be delivered to the second reservoir 206. Alternatively, the first gas pump 208 and the second gas pump 210 are positioned in parallel and each deliver a pressurized fluid to the conduit 218 which is in fluid communication with the second reservoir 206. In one embodiment, the first gas pump 208 and the second gas pump 210 are pneumatic pumps. In another embodiment, the first gas pump 208 and the second gas pump 210 are hydraulic pumps.

A gas source 214 is in fluid communication with the first gas pump 208 via a conduit 216. In one embodiment, the gas source 214 is a hydrogen source. In another embodiment, the gas source 214 is an ammonia source. In operation, gas is delivered at approximately atmospheric pressure from the gas source 214 to the first gas pump 208. The first gas pump 208 increases a pressure of the gas and delivers the pressurized gas through a conduit 234 which is in fluid communication with the second gas pump 210. The second gas pump 210 further increases the pressure of the gas and delivers the further pressurized gas to the second reservoir through the conduit 218 which is in fluid communication with the second reservoir 206 via a port 248 formed in the second reservoir 206. In one embodiment, the first gas pump 208 and the second gas pump 210 are operable to generate gas pressures of up to about 40,000 psi.

In one embodiment, the gas pumps 208, 210 and the second reservoir 206 are formed from the same material. In one embodiment, the material selected for the gas pumps 208, 210 and the second reservoir 206 is a stainless steel material, a nickel containing stainless steel material, a nickel molybdenum containing stainless steel material, a nickel chromium stainless steel material, and combinations and mixtures thereof. The materials selected for the gas pumps 208, 210 and the second reservoir 206 are selected to be substantially inert to the pressurized gases flowing therethrough. As such, corrosion of the gas pumps 208, 210 and the second reservoir 206 is reduced which lengthens the useful life of the apparatus and improved the operation thereof by reducing the probability of a catastrophic failure under the elevated pressures generated therein.

A port 250 is also formed in the second reservoir 206. The port 250 is in fluid communication with the conduit 154, 158. A valve 232 is disposed on the conduit 154, 158 which selectively enables fluid communication between the second reservoir 206 and the second volume 104.

In operation, a pressurized fluid is generated by the pumps 208, 210 and delivered to the second reservoir 206. The second reservoir 206 functions as a pressure vessel to hold the fluid in a pressurized state until the fluid is delivered to the second volume 104. A controller 254 is in fluid communication between the second reservoir 206 and the second volume 104 via a conduit 230. The controller 254 measures a pressure within the second volume 104 and determines whether more or less fluid is needed in the second volume 104 to maintain a set pressure point or range of pressure. The controller 254 is also in communication with one or both of the valves 160, 168 and the valve 232 to facilitate fluid delivery to the second volume 104. Thus, the controller 254 provides for closed loop control to enable maintenance of a desired process pressure within the second volume 104.

In summation, apparatus for high pressure processing are described herein. Fluid delivery modules enable generation of fluids at high pressure and facilitate delivery of such fluids to a volume of a process chamber. In one embodiment, the fluid delivery module for generation and delivery of a pressurized fluid includes a second reservoir fabricated from corrosion resistant materials. A first reservoir receives a fluid precursor and delivers the fluid precursor to the second volume. The first reservoir and the second reservoir are in fluid communication with the second volume to coat the chamber and perform high pressure processing in the process chamber, respectively. Various containment apparatus and pressure relief architectures are also described herein to enable safe and efficient operation of apparatus during high pressure processing.

While the foregoing is directed to embodiments of the present disclosure, other and further embodiments of the disclosure may be devised without departing from the basic scope thereof, and the scope thereof is determined by the claims that follow.

What is claimed is:

1. A high pressure processing apparatus, comprising:
   a first chamber body defining a first volume therein;
   a second chamber body disposed within the first volume, the second chamber body defining a second volume therein;
   a fluid delivery module in fluid communication with the second volume, the fluid delivery module comprising:
   a first reservoir;
   a first conduit extending between the first reservoir and the second volume;
   a flow regulator disposed on the first conduit;
   a second reservoir in fluid communication with one or more gas pumps; and
   a second conduit extending between the second reservoir and the second volume.

2. The apparatus of claim 1, wherein the first reservoir and the one or more gas pumps are fabricated from a nickel containing steel alloy.

3. The apparatus of claim 2, wherein the nickel containing steel alloy comprises molybdenum.

4. The apparatus of claim 3, wherein the nickel containing steel alloy comprises chromium.

5. The apparatus of claim 1,
   wherein the second conduit is disposed within a heater jacket, the heater jacket being operable to maintain a temperature of the second conduit at a temperature greater than about 350° C.

6. The apparatus of claim 1, wherein the plurality of gas pumps and the second reservoir are operable at pressures greater than about 50 bar.

7. The apparatus of claim 1, further comprising:
   an enclosure containing the first reservoir, the second reservoir, and the one or more gas pumps therein.

8. The apparatus of claim 1, further comprising:
   a first valve disposed on the first conduit;
   a second valve disposed on the second conduit; and
   a third valve disposed on the second conduit between the second valve and the first chamber body.

9. The apparatus of claim 8, wherein the second conduit is disposed within a heater jacket, the heater jacket being operable to maintain a temperature of the second conduit at a temperature greater than about 350° C.

10. The apparatus of claim 1, wherein the first volume defined by the first chamber body is between about 80 L and about 150 L.

11. The apparatus of claim 10, wherein the second volume defined by the second chamber body is between about 3 L and about 8 L.

12. A high pressure processing apparatus, comprising:
   an enclosure defining a volume therein;
   a first reservoir disposed within the volume, the first reservoir comprising a plurality of ports;
   a second reservoir disposed within the volume, the second reservoir comprising a plurality of ports;
   a first gas pump;
   a second gas pump disposed between the first gas pump and the second reservoir; and a conduit extending between the second gas pump and the second reservoir.

13. The apparatus of claim 12, wherein the enclosure further comprises:
a fluid inlet port; and
an exhaust port.

14. The apparatus of claim 12, wherein the second reservoir, the first gas pump, and the second gas pump are fabricated from a nickel containing steel alloy.

15. The apparatus of claim 14, wherein the nickel containing steel alloy comprises molybdenum.

16. The apparatus of claim 15, wherein the nickel containing steel alloy comprises chromium.

17. A high pressure processing apparatus, comprising:
a first chamber body defining a first volume therein;
a first slit valve door coupled to the first chamber body;
a second chamber body disposed within the first volume, the second chamber body defining a second volume therein;
a second slit valve door coupled to the second chamber body;
a fluid delivery module in fluid communication with the second volume via a plurality of conduits, the fluid delivery module comprising:
a first reservoir in fluid communication with the second volume via a first conduit of the plurality;
a second reservoir comprising a fluid inlet port and a fluid outlet port, the second reservoir fabricated from a nickel containing steel alloy in fluid communication with the second volume via a second conduit; and
a plurality of gas pumps fabricated from the nickel containing steel alloy; and
a second gas pump fabricated from the nickel containing steel alloy, the second gas pump in fluid communication with each of the first gas pump and the second reservoir.

18. The apparatus of claim 17, further comprising:
a flow regulator disposed on the first conduit between the first reservoir and the second volume.

19. The apparatus of claim 17, wherein the first reservoir further comprises:
a fluid inlet port;
a first fluid outlet port; and
a second fluid outlet port.

20. The apparatus of claim 17, wherein the plurality of gas pumps comprise a first gas pump and a second gas pump, wherein the second gas pump is in fluid communication with each of the first gas pump and the second reservoir.

* * * * *